(12) United States Patent
Goodwin et al.

(10) Patent No.: US 9,243,901 B2
(45) Date of Patent: Jan. 26, 2016

(54) RULES FOR REDUCING THE SENSITIVITY OF FRINGE PROJECTION AUTOFOCUS TO AIR TEMPERATURE CHANGES

(71) Applicant: Nikon Corporation, Tokyo (JP)

(72) Inventors: Eric Peter Goodwin, Tucson, AZ (US); Daniel G. Smith, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 176 days.

(21) Appl. No.: 13/801,961

(22) Filed: Mar. 13, 2013

(65) Prior Publication Data

US 2014/0049761 A1    Feb. 20, 2014

Related U.S. Application Data

(60) Provisional application No. 61/683,650, filed on Aug. 15, 2012.

(51) Int. Cl.
| | |
|---|---|
| *G03B 27/54* | (2006.01) |
| *G03B 27/34* | (2006.01) |
| *G01B 11/25* | (2006.01) |
| *G02B 27/42* | (2006.01) |
| *G03F 9/00* | (2006.01) |

(52) U.S. Cl.
CPC ........ *G01B 11/2527* (2013.01); *G02B 27/4255* (2013.01); *G03F 9/7026* (2013.01)

(58) Field of Classification Search
CPC .... G03F 7/20; G03F 7/70575; G02B 11/2527

USPC ............... 355/52, 53, 67–71, 55–56; 356/616
See application file for complete search history.

(56) References Cited

U.S. PATENT DOCUMENTS

| | | |
|---|---|---|
| 2007/0098324 A1 | 5/2007 | Kitamura et al. |
| 2010/0245829 A1 | 9/2010 | Goodwin et al. |
| 2010/0302523 A1* | 12/2010 | Shiraishi ........................ 355/67 |
| 2011/0071784 A1 | 3/2011 | Smith et al. |
| 2012/0008150 A1* | 1/2012 | Smith et al. .................... 356/616 |
| 2013/0208104 A1 | 8/2013 | Goodwin et al. |

FOREIGN PATENT DOCUMENTS

WO    WO 2012/177663 A2    12/2012

OTHER PUBLICATIONS

U.S. Appl. No. 13/794,353, filed Mar. 11, 2013, Goodwin et al.

* cited by examiner

*Primary Examiner* — Hung Henry Nguyen
(74) *Attorney, Agent, or Firm* — Klarquist Sparkman, LLP

(57) ABSTRACT

Fringe projection autofocus systems are provided with variable pitch diffraction gratings or multiple diffraction gratings so that a reference beam and a measurement beam propagate along a common path. Alternatively, an input beam can be directed to a diffraction grating so that the selected diffraction orders propagate along a common path. In some examples, distinct spectral bands are used for reference and measurement beams.

44 Claims, 13 Drawing Sheets

| | λ | AOI | Θ+ | Θ- | Θ |
|---|---|---|---|---|---|
| ---→ | 0.65 | -69.913 | 74.00 | 66.50 | 70.25 |
| ───→ | 0.75 | -67.20 | 71.33 | 63.69 | 67.51 |
| ·····→ | 0.85 | -64.58 | 68.77 | 60.96 | 64.87 |

| | λ | T | Θ+ | Θ- | Θ |
|---|---|---|---|---|---|
| ----> | 0.65 | 22.5 | 75.48 | 65.54 | 70.51 |
| ········> | 0.75 | 25.965 | 75.48 | 65.54 | 70.51 |
| ········> | 0.85 | 29.43 | 75.48 | 65.54 | 70.51 |

TO DETECTOR

| λ | AOI | T (grating period, um) | θ+ | 0-order | θ- |
|---|---|---|---|---|---|
| 0.65 | -65.545 | 11.25 | 75.48 | 65.545 | 58.48 |
| 0.75 | -75.48 | 12.98 | Evanescent | 75.48 | 65.545 |
| 0.85 | -69.913 | 29.43 | 75.48 | 69.913 | 65.545 |

Unwanted orders 1:

| λ | AOI | T | 2 | 1 | 0 | -1 | -2 |
|---|---|---|---|---|---|---|---|
| 0.65 | -75.48 | 29.43 | N/A | 81.950 | 75.480 | 71.080 | 67.501 |
| 0.75 | -69.913 | 11.25 | N/A | N/A | 69.913 | 60.752 | 53.692 |
| 0.85 | -65.545 | 12.98 | N/A | 77.360 | 65.545 | 57.652 | 51.200 |

Unwanted orders 2:

| λ | AOI | T | 2 | 1 | 0 | -1 | -2 |
|---|---|---|---|---|---|---|---|
| 0.65 | -75.48 | 12.98 | N/A | N/A | 75.480 | 66.634 | 60.218 |
| 0.75 | -69.913 | 29.43 | 81.948 | 74.722 | 69.913 | 66.020 | 62.648 |
| 0.85 | -65.545 | 11.25 | N/A | 80.345 | 65.545 | 56.588 | 49.393 |

RULES FOR REDUCING THE SENSITIVITY OF FRINGE PROJECTION AUTOFOCUS TO AIR TEMPERATURE CHANGES

CROSS REFERENCE TO RELATED APPLICATION

This application claims the benefit of U.S. Provisional Application 61/683,650, filed Aug. 15, 2012, which is incorporated herein by reference.

FIELD

The disclosure pertains to autofocus systems for lithography.

BACKGROUND

The prior design approaches for fringe projection autofocus systems irradiate wafer and reference surfaces with the same grating and illumination angle for all wavelength bands. Some such systems are described in Smith et al., U.S. patent application Ser. No. 13/066,741, Smith et al., U.S. Patent Application Publication 2011/0071784, Goodwin et al., U.S. Provisional Patent Application 61/575,330, Goodwin et al., U.S. Patent Application Publication 2010/0245829, Goodwin et al., U.S. Provisional Patent Application 61/500,521, and Goodwin et al., U.S. Provisional Patent Application 61/647,324, all of which are incorporated herein by reference. In such systems all wavelength bands have nominally the same sensitivity to wafer height changes. In these systems, optical path differences (OPDs) such as those due to thermal/pressure changes in air are wavelength dependent. Because errors due to air turbulence are different for different wavelength bands, height measurements and focus correction are difficult.

SUMMARY

By tuning the angle of incidence for different wavelength bands of an input optical flux and/or appropriate selection of grating pitches, a fringe projection autofocus system can be made to have equal optical axis (z) sensitivity and equal OPD error sensitivity for various wavelength components or bands that provide a reference signal.

In some examples, autofocus systems for lithography include a fringe projection system including at least one diffraction grating. The diffraction grating is configured to project fringes such that angles of incidence of a received optical radiation flux vary with wavelengths of the optical radiation flux, or the diffraction grating is configured to have a variable grating period. A detection system is configured to receive projected fringes and produce an indication of a displacement of a target surface. In further examples, the diffraction grating has a variable grating period selected so that diffraction angles for at least two wavelength components of the received optical flux have substantially the same diffraction angles. In some embodiments, the indication of a displacement is a reference signal based on fringes projected onto a reference surface. In still additional examples, the at least one diffraction grating comprises a plurality of displaced diffraction gratings configured to receive selected wavelengths of the optical radiation flux. Lithographic systems comprise projection exposure apparatus that include such autofocus systems.

Methods of producing a reference signal in a fringe projection autofocus system comprise varying angles of incidence of portions of an interrogation flux to a diffraction grating based on wavelengths associated with the portions. Additional methods comprise producing diffraction orders by directing an optical flux to a diffraction grating having a variable grating period.

Autofocus systems for lithography comprise a fringe projection system configured to project fringes based on optical radiation at a plurality of wavelengths, wherein the fringes are projected so that diffraction orders for the plurality of wavelengths propagate along a common path. In some examples, a reference surface is situated so as to produce a reference optical flux, and an error estimator is configured to produce an autofocus error based on the reference optical flux. In typical examples, the common path includes at least a portion of an optical path situated proximate a detector configured to detect the projected fringes. In other embodiments, the fringe projection system is configured to produce a measurement flux, wherein the reference flux and the measurement flux propagate along the common path. In still additional examples, the reference and measurement fluxes exhibit a common error associated with fringe detector heating. In still other examples, fringe projection autofocus systems are configured to project fringes in a first wavelength band to a reference surface to produce a reference beam, and to project fringes in a second wavelength band to a substrate surface to produce a measurement beam.

Autofocus systems for lithography comprise a fringe projection system that includes a diffraction grating configured to project fringes using at least two optical beams in associated wavelength bands such that fringe phase contributions corresponding to surface displacements and optical path length variations associated with the at least two optical beams have a common wavelength dependence. A detection system is configured to receive the projected fringes and determine a fringe phase. In some examples, a controller is configured to adjust a focus of a reticle pattern on a target surface based on the determined fringe phase. In other examples, the fringe phase contributions correspond to target surface displacements, and optical path length variations associated with propagation of the at least two optical beams are substantially independent of wavelength. In still other embodiments, the diffraction grating is situated so that the at least two optical beams are incident to the diffraction grating at angles of incidence so that target surface displacements and optical path length variations associated with propagation of the optical beams are substantially independent of wavelength for the at least two optical beams. According to some examples, the fringe projection system is configured so that projected fringes associated with the at least two optical beams are based on common diffraction orders or different diffraction orders.

According to some examples, the fringe projection system includes an aperture plate situated to block at least one diffraction order associated with each of the at least two optical beams. In some examples, the aperture plate is situated to block at least one diffraction order that is different for each of the at least two beams. In further examples, the fringe projection system is configured so two diffractions orders are selected for each of the at least two optical beams such that sin $\theta$ sin $\Delta\theta$ is substantially the same for the at least two optical beams, wherein $\theta$ is an average angle of incidence and $\Delta\theta$ is a diffraction angle difference between the two diffraction orders. In representative examples, the diffraction grating is configured to have at least two grating pitches corresponding to the at least two optical beams so that target surface displacements and optical path length variations associated with propagation of the optical beams are substantially independent of wavelength. In some typical examples, the fringe projection system is configured so that projected fringes associated with the at least two optical beams are based on common diffraction orders or different diffraction orders. In some examples, the fringe projection system includes an aperture plate situated to block at least one diffraction order associated with each of the at least two optical beams. In other alternatives, the aperture plate is situated to block at least one diffraction order that is different for each of the at least two beams. According to some examples, the diffraction grating includes a first grating segment and a second grating segment associated with the first and second grating pitches, respectively. In some embodiments, the diffraction grating is situated so that the at least two optical beams are incident to the diffraction grating at a common angle of incidence and/or so that diffraction orders that form the projected fringes are diffracted at substantially the same diffraction angles for the at least two optical beams.

In some examples, the fringe projection optical system includes a beam combiner situated to receive diffraction orders from the segmented gratings and direct the diffraction orders along respective common optical paths. In some cases, the beam combiner includes a dichroic filter configured to reflect diffraction orders associated with a first of the at least two optical beams and transmit diffraction orders associated with a second of the at least two optical beams so as to direct diffraction orders of the first or second of the at least two optical beams to the common optical paths. In other cases, the dichroic filter is configured to reflect diffraction orders associated with a first of the at least two optical beams so as to direct diffraction orders of the first of the at least two optical beams to the common optical paths. In further examples, the beam combiner includes a reflective surface configured to reflect the diffraction orders of the second of the at least two optical beams so as to direct diffraction orders of the second of the at least two optical beams to the common optical paths.

In other example embodiments, the fringe projection system includes a sending-side beam splitter configured to receive diffraction orders associated with a first optical beam and a second optical beam and direct the first optical beam to a reference surface and the second beam to a target surface. In representative examples, the fringe projection system includes a receiving-side beam splitter configured to receive diffraction orders associated with the first optical beam and the second optical beam from the reference surface and the target surface, respectively, and direct the combined first and second optical beams to a detector. In further examples, the sending-side beam splitter is configured to reflect the first optical beam to the reference surface, and the receiving-side beam splitter is configured to reflect the second optical beam. In other examples, the sending-side beam splitter is configured to transmit the first optical beam to the reference surface, and the receiving-side beam splitter is configured to transmit the second optical beam. In yet other examples, the diffraction grating defines gratings of different pitches for the at least two optical beams in a common grating area, and the at least two optical beams are directed to the common grating area. In some examples, the diffraction grating is situated so that the at least two optical beams are incident to the common grating area at a common angle of incidence or so that diffraction orders that form the projected fringes are diffracted by the common grating area at substantially the same diffraction angles for the at least two optical beams.

The autofocus systems can be configured so that the fringe projection optical system includes a beam combiner situated to receive diffraction orders from the common grating area of the diffraction grating and direct the diffraction orders along respective common optical paths. A dichroic filter is configured to reflect diffraction orders associated with a first of the at least two optical beams so as to direct diffraction orders of the first of the at least two optical beams to the common optical paths. A reflective surface is configured to reflect the diffraction orders of the second of the at least two optical beams so as to direct diffraction orders of the second of the at least two optical beams to the common optical paths. In some cases, the diffraction grating has a variable grating period selected so that diffraction angles for at the at least two optical beams are substantially the same and a controller is configured to provide an indication of a displacement based on fringes projected onto a reference surface. In typical examples, diffraction grating comprises a plurality of displaced diffraction grating segments configured to receive corresponding optical beams.

Methods of establishing a focus adjustment comprise projecting fringes formed by combining selected diffraction orders of at least two optical beams having different wavelengths, wherein surfaces displacements and optical path length variations associated with propagation of the selected diffraction orders beams have a common wavelength dependence on the wavelengths of the at least two optical beams. A focus adjustment is estimated based on shifts in the projected fringes. In some examples, angles of incidence of the at least two optical beams are varied based on the associated wavelengths. In other examples, the diffraction orders are formed by directing the first and second optical beams to respective first and second segments of a diffraction grating. In other examples, the diffraction orders are formed by directing the first and second optical beams to a common diffraction grating area having different grating pitches for the first optical beam and the second optical beam. In some examples, the projected fringes are configured so that two diffractions orders are selected for each of the at least two optical beams such that $\sin \theta \sin \Delta\theta$ is substantially the same for the at least two optical beams, wherein $\theta$ is an average angle of incidence and $\Delta\theta$ is a diffraction angle difference between the two diffraction orders.

Lithographic systems comprise a projection system configured to image a reticle on a sensitized substrate. An autofocus system is configured to adjust a focus of the image on the substrate. The autofocus system comprises a fringe projection system configured to project fringes using a plurality of optical beams in associated wavelength bands such that fringe phase contributions corresponding to surface displacements and optical path length variations associated with propagation of the plurality of optical beams have a common wavelength dependence. A detection system is configured to receive the projected fringes and determine a fringe phase, and a controller is configured to adjust focus based on the determined fringe phase. In some examples, the fringe projection system is configured to project fringes so that diffraction orders for the plurality of wavelengths propagate along common paths. In further examples, the fringe projection system is configured to project fringes on a substrate surface and a reference surface, wherein the controller is configured to adjust focus based on a fringe phase associated with the reference surface. In other examples, fringe portions associated with the reference surface and the substrate surface propagate along a common optical path at the detection system and the common path includes at least a portion of an optical path situated proximate a detector configured to detect the projected fringes.

The foregoing and other features and advantages of the disclosed technology will become more apparent from the following detailed description, which proceeds with reference to the accompanying figures.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The disclosed examples are described with reference to one or more optical beams that refer to propagating electromagnetic radiation, typically at wavelengths between about 200 nm and 2 μm, but other wavelengths can be used. In some examples, optical beams have associated spectral bandwidths, and such beams can originate from one or a plurality of sources. Diffraction order generally refers to propagating electromagnetic radiation associated with diffraction of an optical beam at a particular angle as specified by a diffraction equation.

Theoretical Framework

For purposes of explanation, a theoretical framework is set forth below. The disclosure is not to be limited by this theoretical framework and it is intended only to illustrate operational aspects of selected embodiments.

Figure 1:
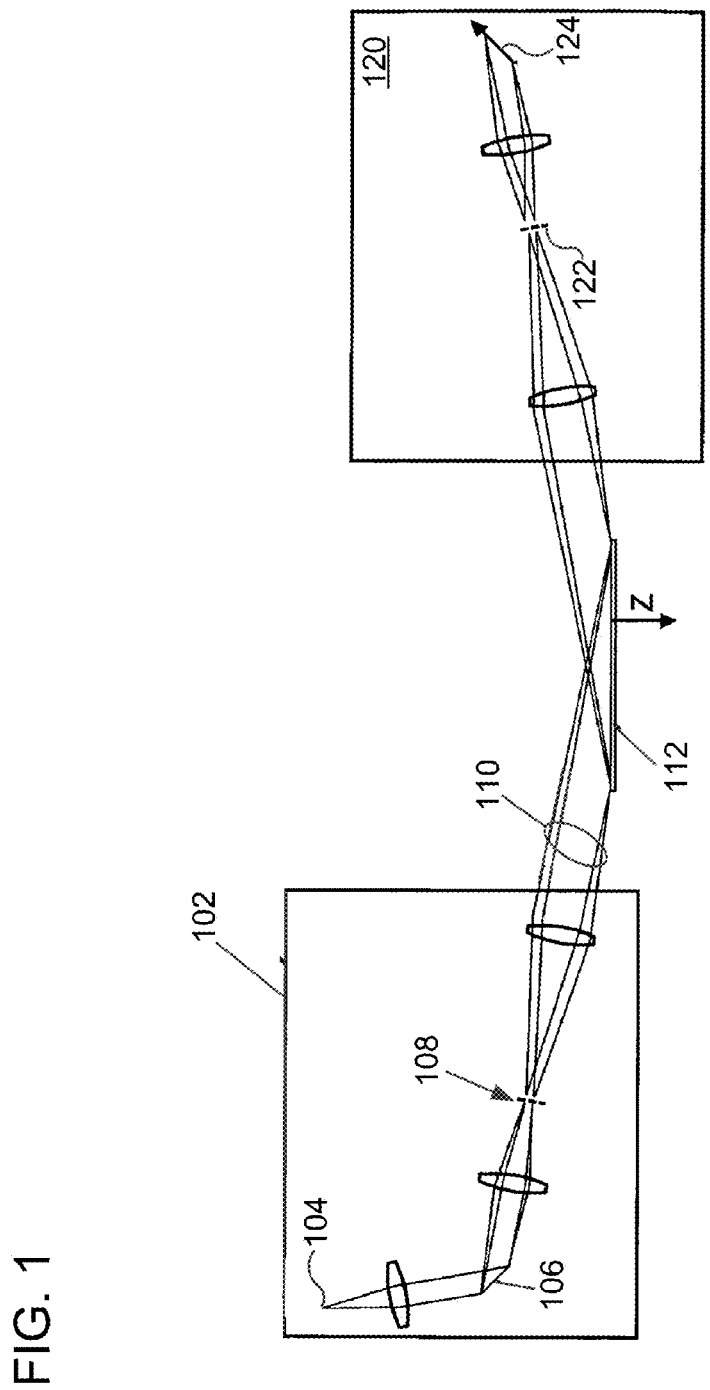
FIG. 1 illustrates a representative fringe projection based autofocus arrangement.

Referring to FIG. 1, a representative pattern transfer system with fringe projection autofocus includes a fringe generator 102 that includes an optical radiation source 104 that delivers an optical beam to a diffraction grating 106. The diffracted beam is focused at a spatial filter 108 that is configured to transmit +1, −1 diffraction orders and block $0^{th}$ orders. (Other diffraction orders can be selected as convenient.) Combined +1, −1 beams 110 are directed to a wafer or other workpiece 112, and then to a fringe detection system 120 that includes a spatial filter 122 that is configured to transmit +1, −1 diffraction orders and block $0^{th}$ diffraction orders. The spatially filtered beams are then directed to a photodetector 124, and the photodetector signal used to determine focus adjustments (z-axis adjustments) due to fringe dependence on z-axis position. A portion of the input optical beam is delivered to a reference surface so as to provide a reference signal. Details of such systems can be found in Smith and Goodwin, U.S. Patent Application Publication 2012/0008150A1, which is incorporated herein by reference.

Fringe projection autofocus systems such as those of FIG. 1 typically use the same grating for all wavelengths, along with a common angle of incidence for all wavelength bands. Only the +1 and −1 diffraction orders are used to image the grating onto the wafer, and since the illumination angle of the grating is off-axis, the mean angle between the +1 and −1 orders is wavelength dependent. This leads to a slightly different z-sensitivity for the multiple wavelength bands. For convenient description of the disclosed methods and apparatus, this small difference is neglected, and it will be assumed that conventional fringe projection systems have about the same z-sensitivity for each wavelength band, as given by the following:

$$z_w = \frac{\Delta\phi}{2\Delta k_z} \tag{1}$$

$$\Delta\phi = \frac{8\pi \sin\theta \sin\Delta\theta}{\lambda} z_w \tag{2}$$

$$\Delta k_z = \frac{4\pi \sin\theta \sin\Delta\theta}{\lambda} \tag{3}$$

$$z_{w,est} = \frac{\Delta\phi}{2\Delta k_z} + \frac{\delta}{4\sin\theta\sin\Delta\theta} \tag{4}$$

wherein $z_{w,est}$=wafer z displacement sensitivity, $\delta$=optical path difference (OPD), $k_Z$=wave vector magnitude ($2\pi/\lambda$), $\lambda$=wavelength, $\Delta\Phi$=phase change of projected fringes, $\theta$=average angle of incidence, and $\Delta\theta$=angle difference between diffraction orders such as +1 and −1 orders. As shown above, an estimate of the wafer height $z_{w,est}$ is equal to a phase change of the fringes divided by $\Delta k_z$, which is a constant that depends on the average angle of incidence, a diffraction angle difference between the two diffraction orders ($\Delta\theta$), and the mean source wavelength $\lambda$. Since $\Delta\theta$ is approximately linear with wavelength (based on the grating equation), $\Delta k_z$ is approximately independent of wavelength. The phase shift introduced by an OPD ($\delta$) change such as produced by air temperature changes is approximately proportional to $\delta/\lambda$ since $\lambda$ and $\Delta\theta$ are dependent. In other words, the z-error introduced by an OPD change is proportional to the mean wavelength. Practically, this means air turbulence has a different magnitude influence on detected fringe shifts that corresponds to a ratio of beam wavelengths (for 850 nm and 650 nm beams, a ratio of 850/650 or a 30% difference) from the different sources while the wafer z-sensitivity is constant as a function of wavelength, neglecting variations in mean difference in angles between diffracted orders as noted above. Therefore, a reference surface is not well suited for correction of both mechanical drifts and air turbulence errors since these two types of errors sum together to make the total error that should be correctable with the use of a reference surface.

Figure 2:
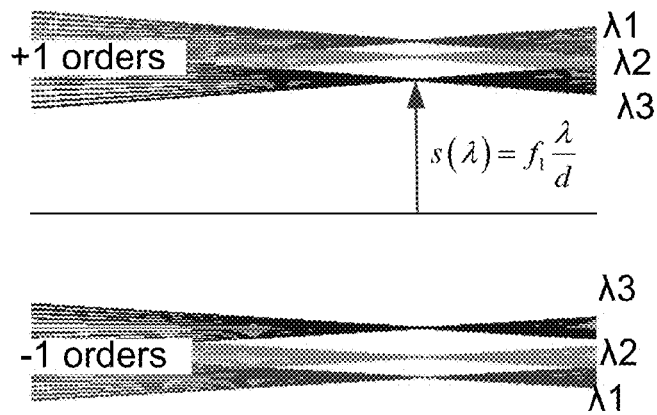
FIG. 2 illustrates errors associated with multiple wavelength fringe projection.

FIG. 2 illustrates z-axis (i.e., focus) error variation due to wavelength dependence of contributions from changes in air temperature. Assuming dn/dT of air is constant, OPD($\lambda$)=100 nm. To convert this OPD into a phase shift of the fringes and then wafer z-error, divide by the wavelength and multiply by $k_z$=12.7 µm/fringe for all wavelengths: Measurement 1 ($\lambda_{avg}$=850 nm): (100/850) fringes*12.7 µm/fringe =1.49 µm error; and measurement 2 ($\lambda_{avg}$=750 nm): (100/750) fringes*12.7 µm/fringe =1.69 µm error. Thus, a measurement at the first wavelength will return 1.49 µm z error while a measurement at the second wavelength will return a 1.69 µm z error; and the ratio of the errors is the ratio of the wavelengths. Sensitivity to air turbulence is wavelength dependent and therefore unequal for different wavelength bands. Since shifts of the optics or the CCD introduce the same amount of phase change for each wavelength band and $\Delta k_z$ is the same across the wavelength, these effects tend to cancel.

Disclosed herein are representative methods and apparatus that tend to make dependence on (1) mechanical drifts and (2) OPD errors equal for the measurement wavelengths and the reference signal so as to mitigate the difficulties outlined above.

Referring to the equations 1-4 above, $\Delta k_z$ does not have to be constant with wavelength. If it is allowed to vary with wavelength the same way as the OPD term as shown below, sensitivity to air turbulence can be reduced or eliminated.

$$\sin\theta_{in}\sin\theta_{out} = \frac{m\lambda}{T} \tag{5}$$

$$\theta^+ = \sin^{-1}\left(\frac{\lambda}{T} - \sin\theta_i\right) \text{ and } \theta^- = \sin^{-1}\left(-\frac{\lambda}{T} - \sin\theta_i\right) \tag{6}$$

$$\theta = \frac{\theta^+ + \theta^-}{2}\theta^+ = \frac{1}{2}\left[\sin^{-1}\left(\frac{\lambda}{T} - \sin\theta_i\right) + \sin^{-1}\left(-\frac{\lambda}{T} - \sin\theta_i\right)\right] \tag{7}$$

$$\Delta\theta = \theta^+ - \theta^- = \sin^{-1}\left(\frac{\lambda}{T} - \sin\theta_i\right) - \sin^{-1}\left(-\frac{\lambda}{T} - \sin\theta_i\right) \tag{8}$$

$$\sin\theta\sin\Delta\theta = \sin\left\{\frac{1}{2}\left[\sin^{-1}\left(\frac{\lambda}{T} - \sin\theta_i\right) + \sin^{-1}\left(-\frac{\lambda}{T} - \sin\theta_i\right)\right]\right\} \cdot \tag{9}$$
$$\sin\left\{\sin^{-1}\left(\frac{\lambda}{T} - \sin\theta_i\right) - \sin^{-1}\left(-\frac{\lambda}{T} - \sin\theta_i\right)\right\} = \text{Constant}$$

Thus, if [$\sin\theta \sin\Delta\theta$] is constant or substantially constant with wavelength, a fringe projection system can address mechanical drifts and OPD errors. The mean angle and angle difference for the two interfering diffraction orders (typically +1 and −1) depend on the wavelength, the grating pitch, and the angle of incidence, by the grating equation (equation 5). T is the grating pitch and m is the diffraction order. Equations 6-8 describe the +1 order, −1 order, average angle $\theta$ and angle difference $\Delta\theta$.

Equation 9 sets [$\sin\theta \sin\Delta\theta$] equal to a constant in terms of T and $\theta_{in}$, the two variables that are most readily controlled in practical autofocus systems. Options for satisfying this equation in hardware include: 1) varying the angle of incidence (AOI) with wavelength or 2) varying the grating period (T) with wavelength.

EXAMPLE 1

Varying Grating Angles of Incidence

Figure 3A:
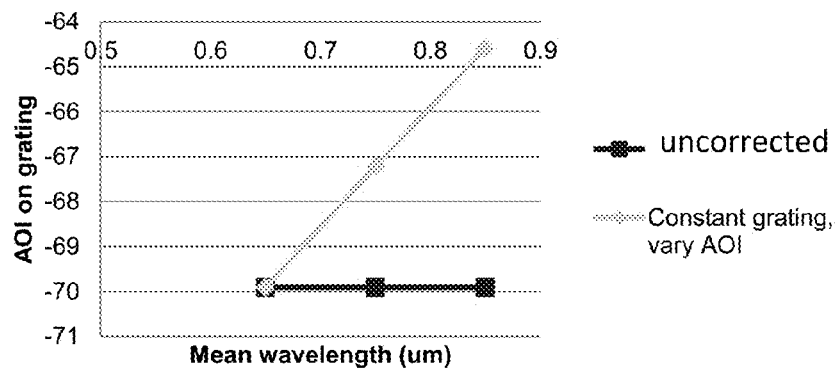
FIG. 3A illustrates reducing wavelength dependences in a fringe projection system by varying an angle of incidence to provide a constant value of sin θ sin Δθ, wherein θ is a mean diffraction angle and Δθ is a difference between diffraction angles of the selected diffraction orders.

One approach is to keep the grating period fixed and vary the illumination angle for the various wavelength bands. FIG. 3A shows the angle of incidence (AOI) varying from −70 degrees to −64.5 degrees with wavelengths from 500 nm to 900 nm so as to keep $\sin\theta \sin\Delta\theta$ constant. AOIs for optical beams at three particular wavelengths are indicated, along with a constant AOI. As shown in FIG. 3A, changes to optical beam AOI as a function of wavelength can be used, subject to the potential disadvantage that the numerical aperture (NA) of an associated optical system may need to increase to accommodate a larger angular spread of the diffraction orders. In addition, the optical path in a fringe projection system will be somewhat different so that a correlation of air turbulence effects may be different from beam to beam, and somewhat worse than in conventional constant AOI systems.

Figures 4A, 4B:
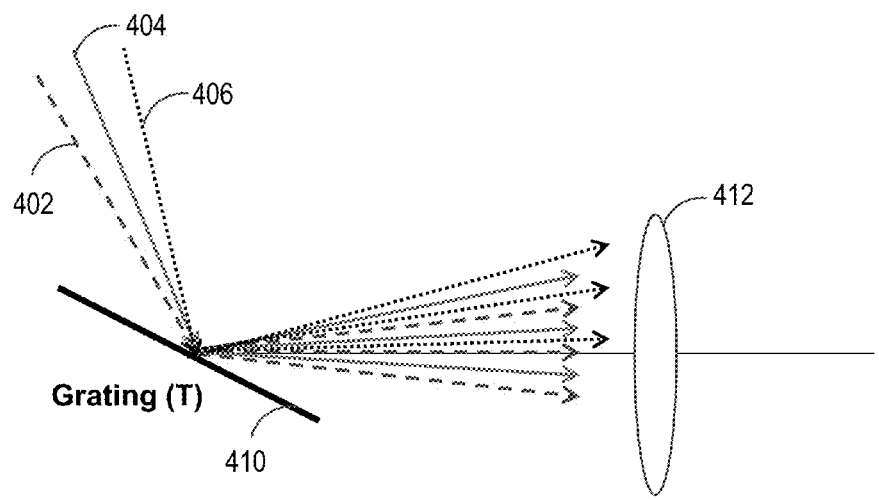
FIGS. 4A-4B pertain to a fringe projection system that includes a diffraction grating situated to receive an optical flux at angles of incidence based on wavelengths associated with the optical flux.

FIGS. 4A-4B illustrate details of a fringe projection system using variable AOI. FIG. 4A tabulates the preferred (variable) AOIs, and the associated diffraction angles $\theta_-$, $\theta_+$ (−1, +1 orders) and a mean diffraction angle $\theta$ for optical beams at 650 nm, 750 nm, and 850 nm. FIG. 4B illustrates optical beam axes of incidence 402, 404, 406 for the optical beams at 650 nm, 750 nm, and 850 nm, respectively, to a grating 410. Three diffraction orders (−1, 0, +1) are shown for each beam, although typically only the 1−, +1 orders are used. (In some examples, other pairs of orders are used for some or all optical beams). A lens 412 is situated to receive the diffraction orders. In this example, longer wavelength optical beams (e.g., 850 nm) have smaller angles of incidence, the mean angle of incident $\theta(\lambda)$ varies significantly with wavelength, and a NA of the lens 412 increases from about 0.02 in wafer space to 0.031 in wafer space to accept the selected diffraction orders.

EXAMPLE 2

Varying Grating Pitch

Figure 3B:
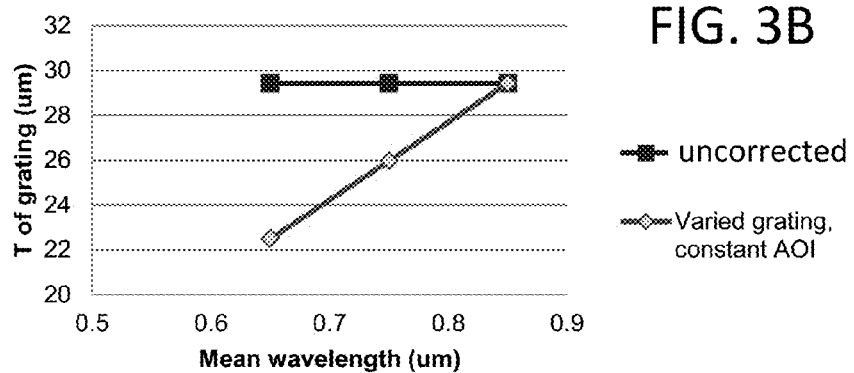
FIG. 3B illustrates reducing wavelength dependences in a fringe projection system by varying grating pitches of an error signal.

FIG. 3B shows variation of grating pitch selected to keep $\sin\theta \sin\Delta\theta$ as constant. As in FIG. 3A, three particular wavelengths are indicated, and a line shows conventional constant grating pitch. In this configuration as well, larger NA optical systems may be required.

Figures 5A, 5B:
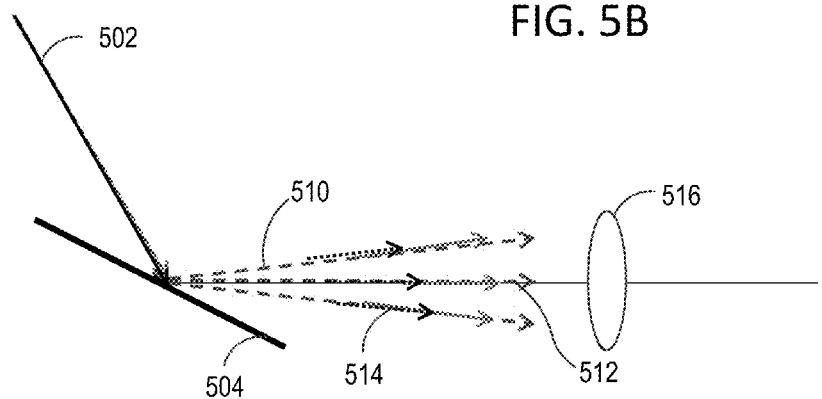
FIGS. 5A-5B pertain to a fringe projection system that includes a variable pitch diffraction grating.

FIGS. 5A-5B illustrate details of a fringe projection system using variable grating pitch. FIG. 5A tabulates the preferred (variable) grating pitches T, the associated diffraction angles $\theta_-$, $\theta_+$ (−1, +1 orders) and a mean diffraction angle $\theta$ for optical beams at 650 nm, 750 nm, and 850 nm. FIG. 5B illustrates diffracted orders 510, 512, 514 propagating substantially along common axes for the −1, 0, +1 diffraction orders of the three beams as incident along a common axis 502 to a diffraction grating 504. Due to common propagation axes, OPD errors tend to be correlated for the multiple optical beams, and a broadband source could be used since all beams are at the same angle of incidence. Of course, multiple beams from difference source can be combined and used as well. Three diffraction orders (−1, 0, +1) are shown for each beam, although typically only the −1, +1 orders are used. (In some examples, other pairs of orders are used for some or all optical beams). A lens 516 is situated to receive the diffraction orders. In this example, longer wavelength optical beams (e.g., 850 nm) have larger grating pitches.

Figure 6:
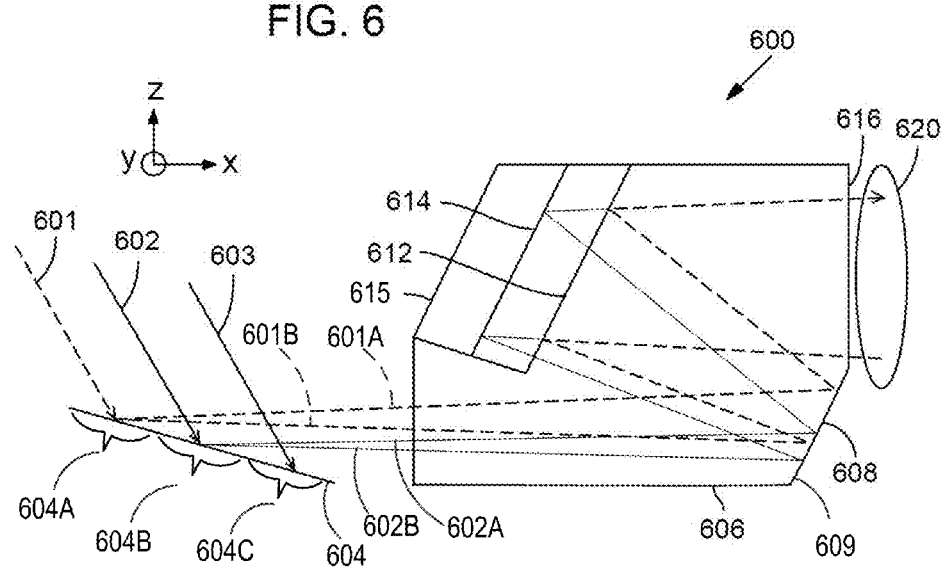
FIG. 6 illustrates a fringe projection system in which different spectral portions of an input optical flux are delivered to different portions of a grating displaced in direction that is partially along a direction of propagation so as to propagate along a common path.

FIG. 6 illustrates a representative optical system 600 that includes a diffraction grating 604 that includes grating sections 604A-604C displaced along an x-axis and having different grating periods. The grating sections 604A, 604B, 604C are configured to receive optical beams along respective parallel axes 601, 602, 603. The optical beams directed along the axes 601-603 can have different or the same wavelengths, but the example of FIG. 6 is intended to illustrate diffraction of different wavelength beams at common diffraction angles by different grating sections. Broadband beams can be used. A prism assembly 606 includes a reflective surface 609 that reflects the diffracted beams towards short pass or long pass filter layers 612, 614 that serve to selectively reflect or transmit optical beams at various wavelengths. For example, as shown in FIG. 6, the filter layers 612, 614 reflect diffraction orders 601A, 601B and 602A, 602B associated with respective grating section 604A, 604B. A prism surface 615 is situated to reflect diffraction orders associated with the grating segment 604C, but these orders are not shown in FIG. 6. The wavelength dependence of filter layer coatings is provided so that diffraction orders for different wavelengths are reflected/transmitted by the appropriate filter layers.

The surface 615 and the filter layers 612, 614 are arranged so that the diffracted orders are combined and exit the prism 606 at an exit surface 616. A lens 620 is situated to direct the combined, overlapping diffraction orders to a wafer and/or a reference surface. The prism 606 can also be situated to receive combined diffraction orders, and separate the orders so as to follow the optical paths shown in FIG. 6 in reverse so as to, for example, separate the different wavelength beams at a fringe detector such as a CCD array. This latter application has the disadvantage that an air path near the CCD would no longer be a common path to all beams, so a large heat source detector such as a CCD could introduce errors. The filter surfaces are shown in FIG. 6 as part of a unitary optical assembly, but in other examples, one or more discrete dielectric filters can be suitably arranged.

Figure 7:
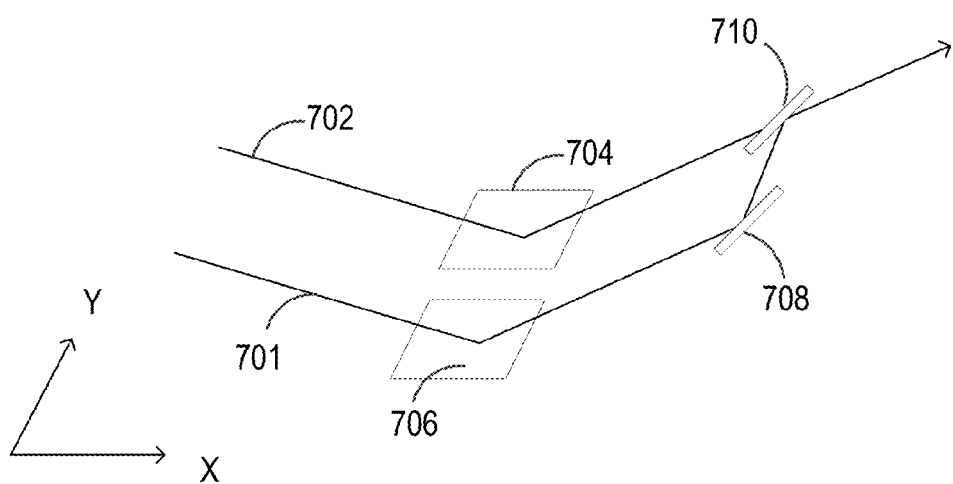
FIG. 7 illustrates a fringe projection system in which different spectral portions of an input optical flux are delivered to different portions of a grating that are displaced in a direction perpendicular to a direction of propagation so as to propagate along a common path.

Another option is to stagger the gratings into the page of FIG. 6 in the y direction, and use mirrors/chromatic beam splitters to combine the different wavelengths. As shown in FIG. 7, optical beams are directed to grating segments 704, 706 along parallel axes 702, 701. Diffraction orders associated with the grating segment 706 are reflected with a mirror 708 and combined with a diffraction orders associated with the grating segment 704 with a dichroic beam combiner or beam splitter 710. The combined diffraction orders are then directed to a wafer surface or reference surface, and associated fringe shifts measured at a detector for evaluation of focus errors. The combined beams can be arranged to propagate along a common optical path except at the grating segments 704, 706, and thus all experience any thermal or other effects. As in FIG. 6, the mirror/beam combiner of FIG. 7 can also be used to separate co-propagating beams.

Separation of the various wavelength portions of the combined optical beams is generally not required. For example, if a detector has a pixelated wavelength selective coating, sets of pixels have different spectral responses so that fringes associated with input optical beams of different wavelengths can be identified. The wavelength bands may be smeared in an optical system pupil if the wavelength bands are wide, but if the wavelength bands have center wavelengths are matched approximately as specified in Equation 9, defocus and dn/dT errors and others can be compensated. Although not shown in FIG. 7, a reference optical beam can be directed to an additional grating or grating segment that is also displaced in a y-direction.

EXAMPLE 3

Beam Combiner/Beam Splitter Systems

Figure 8:
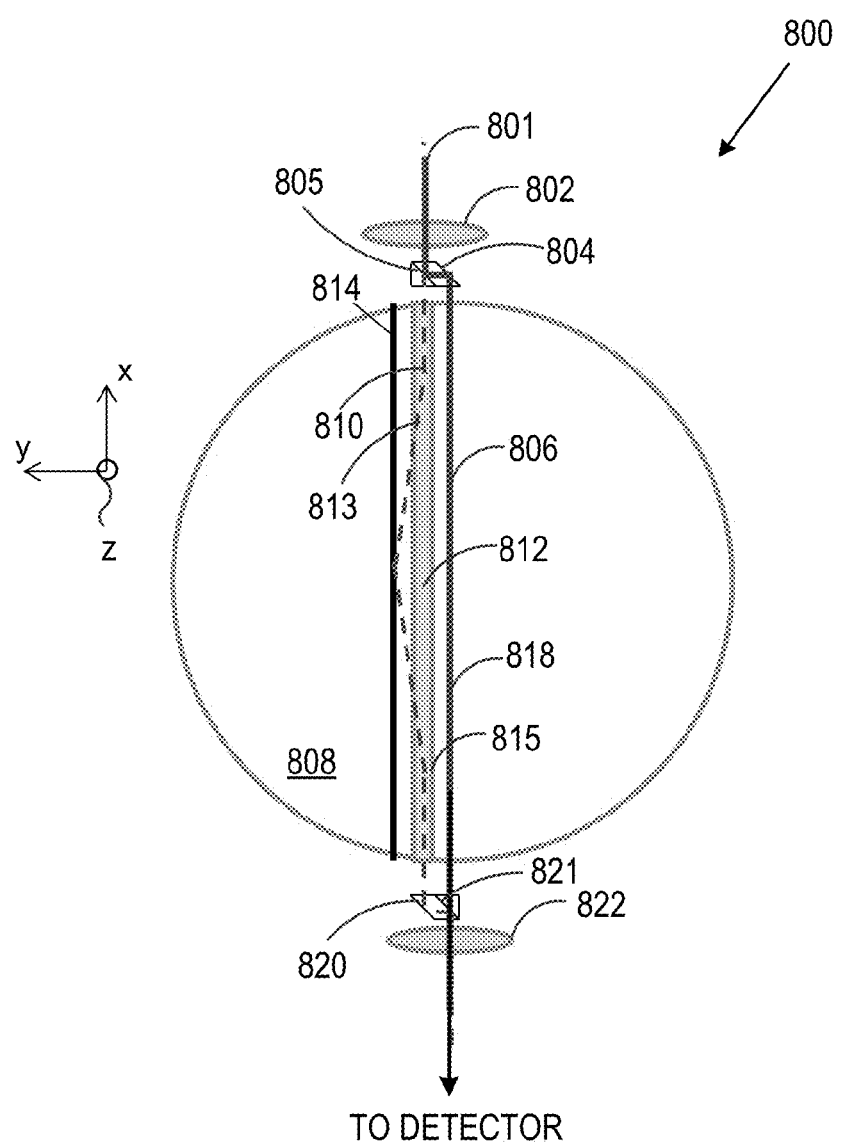
FIG. 8 illustrates a fringe projection optical system in which different spectral components are used to generate reference and measurement beams.

In another example, a reference beam is arranged to traverse an air path near a camera or other portion of an optical path almost exactly, without displacement in z or y, even if the reference beam is at different wavelength than a measurement beam. As shown in FIG. 8, an input beam is directed along an axis 801 through a lens 802 to a sending-side prism module 804. The prism module 804 comprises a dichroic beam splitter layer 805 that transmits a reference wavelength portion of the input beam so as to propagate along an axis 810 to a prism or other reflector 812. At 813, the reference beam is reflected by the prism 812 to a reference mirror 814 that returns the reference beam to the prism 812. In FIG. 8, the reference mirror 814 includes a planar reflective surface that is in an xz-plane. At 815, the reference beam is reflected to as to propagate parallel to an axis 818 of a measurement beam that is incident to a wafer surface 808, and a receiving-side prism module 820 having a dichroic layer 821 receives and combines the measurement and reference beams. The prism modules 804, 820 are configured so that a reference beam is reflected by the prism module 820 and transmitted by the prism module 804 so that reference and measurement beams experience a common optical path length throughout the rest of the optical system. A lens 822 directs the combined beams towards a detector. In the configuration of FIG. 8, the reference wavelength portion of the input beam can be displaced by 4-8 mm or more or less in a y direction depending on a location of the reflections 813, 814 and the reference mirror configuration. The optical paths of reference and measurement beams in FIG. 8 can be reversed so that the input beam is received at the prism 820 and propagates to the prism 804.

In this example, the spectral content of the reference optical beam is different from that of the measurement beam. The spectral bandwidth of the reference beam does not need to be as broad as the measurement beam since the reference light is typically directed to a first surface mirror that serves as a reference surface. A broader spectrum helps counteract phase errors inherent to multilayer reflective structures, such as a production wafer. This prism arrangement allows the reference beam to traverse the same path through the optics almost everywhere, including near a camera where there may be large thermal gradients. This configuration can be used with a chromatic filter mask at a CCD or other fringe detector so that the fringe patterns for multiple wafer measurements and reference measurements are available simultaneously. Alternatively the reference and wafer measurements can be time interleaved. Finally, the system can be configured to produce multiple fringe frequencies that overlap on the same pixels on the CCD, encoding two different signals at different spatial frequencies as described in U.S. patent application Ser. No. 13/794,353, filed Mar. 11, 2013.

A small OPD can be introduced by making one prism module slightly thicker than the other, so that any chromatic leakage through the beam splitter is incoherent with the primary signal, so as to avoid unwanted fringes. The total optical paths through the prism modules are basically equal for measurement and reference, so there are no additional thermal effects.

Note that the optical axis of the receiving side is now displaced in y relative to the optical axis of the sending side. This does not cause any aberrations or other optical issues because beam steering occurs between the last lens of the sending side and the first lens on the receiving side. In addition, the light incident on the dichroic beam splitter coatings is nearly normally incident (+/-~1 degree from the optical axis), so that coating tends to be simple to design and fabricate.

The use of prism modules or the like as disclosed herein allows the reference light to traverse the same air path nearly everywhere in the fringe projection system, with no displacement in y and no displacement in x. In conventional systems, beams are displaced somewhat in y everywhere because the reference grating is displaced in y at the grating, and the reference beam is displaced in x nearly everywhere because the reference uses a different wavelength light with the same grating pitch.

EXAMPLE 4

Multi-Pitch Gratings with Different Diffraction Orders

In another example, a grating is defined so that a single location on a substrate has multiple gratings (at different spatial frequencies) superimposed. Such a grating can be defined and produced holographically. When such a holographic grating is illuminated at the appropriate angles with different wavelength bands, the combination of the diffracted beams (two diffracted orders per band) can be used to project fringes such that the light from all the bands is nominally collinear throughout the optical system. An example of such a system is illustrated in FIGS. 9A-9C.

Figures 9A, 9B, 9C:
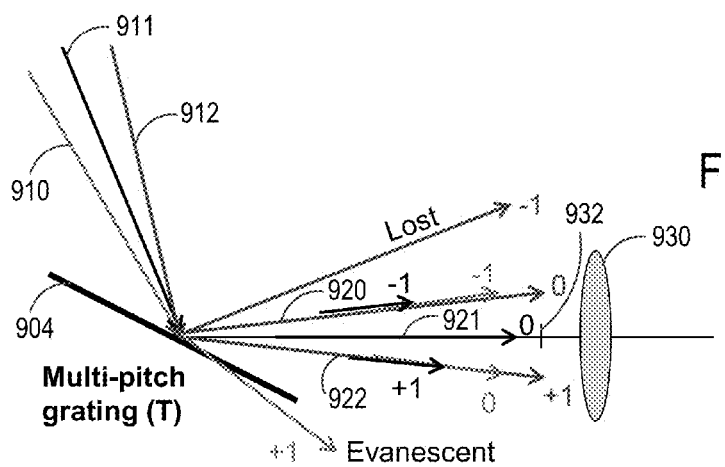
FIGS. 9A-9C pertain to a fringe projection system that includes a multi-pitch diffraction grating and selection of different diffraction orders for different wavelengths.

In the example in FIGS. 9A-9C, a measurement system is configured to use +1 and 0 diffraction orders of a first beam ($\lambda$=650 nm), 0 and −1 diffraction orders of a second beam ($\lambda$=750 nm), and +1 and −1 orders of a third beam ($\lambda$=850 nm). As shown in FIG. 9B, the first, second, and third sources are incident to a multi-pitch grating 904 along respective axes 910, 911, 912 so as to irradiate the grating 904 at different angles. The multi-pitch grating 904 can define different pitches for each of the wavelength bands associated with the beams. As shown in FIG. 9B, the selected orders are diffracted from the grating 904 at substantially the same angles and propagate along diffraction axes 920, 921, 922, while other orders are lost as outside a system NA, or are blocked. In addition to diffraction orders selected for use, FIG. 9A also lists some diffraction orders that are not used, and may correspond to evanescent waves, or that are not transmitted by a measurement optical system.

FIG. 9A lists the selected diffraction orders for the three sources, angles of incidence (AOI), grating periods T, and diffraction angles $\theta$. As shown in FIG. 9A, the selected orders (+1, 0) for the first source have the same diffraction angles (75.45°,) 65.545° as the selected diffraction orders (0, −1) for the second source and the selected diffraction orders (+1, −1) for the third source. In this example, all the sources are associated with different grating pitches, but this is not necessary. For all three wavelength bands, the largest diffraction angle used is 75.48°, and the smallest diffraction angle used is 65.545°. By selecting grating pitches, source wavelengths, and diffraction orders, diffracted beams from a plurality of sources can be directed so as to co-propagate. As shown in FIG. 9B, the −1 diffraction order for the first source is at an angle that is greater than a numerical aperture of fringe projection lens 930. A $0^{th}$ diffraction order for the third source is readily blocked with an aperture 932.

In typical applications, some light from each beam diffracts from each of the superimposed grating pitches, causing light from one or more diffraction orders to appear in unwanted locations. FIG. 9C is a table of diffraction orders for the design of FIG. 9B, showing diffraction angles of additional orders. Shaded blocks indicate angles that may be difficult to remove as being close to angles associated with diffraction orders to be used. For such diffraction orders, angular differences from the selected diffraction orders are small, and distance differences in a pupil (such as the one shown in FIG. 2) are correspondingly small. For example, an angular difference of 0.58° results in about a 1 mm separation in the pupil with a 100 mm focal length lens based on a product of lens focal length and angular separation (f$\theta$). If a mask is used to eliminate diffraction orders with small angular separation, the spectral spread of the diffraction orders to be transmitted must be less than about +/−80 nm from the center wavelength. In some cases, unwanted diffraction orders can be removed from the selected orders with dichroic filters that transmit the desired orders and reflects the unwanted order.

The design of FIGS. 9A-9C is just one example, and can be varied to avoid strict requirements on the sending-side pupil mask. Another benefit to using different angles of incidence for the different light sources is ease of source multiplexing in the illumination system for the fringe projection autofocus system.

EXAMPLE 5

Representative Fringe Projection Methods

Figure 10:
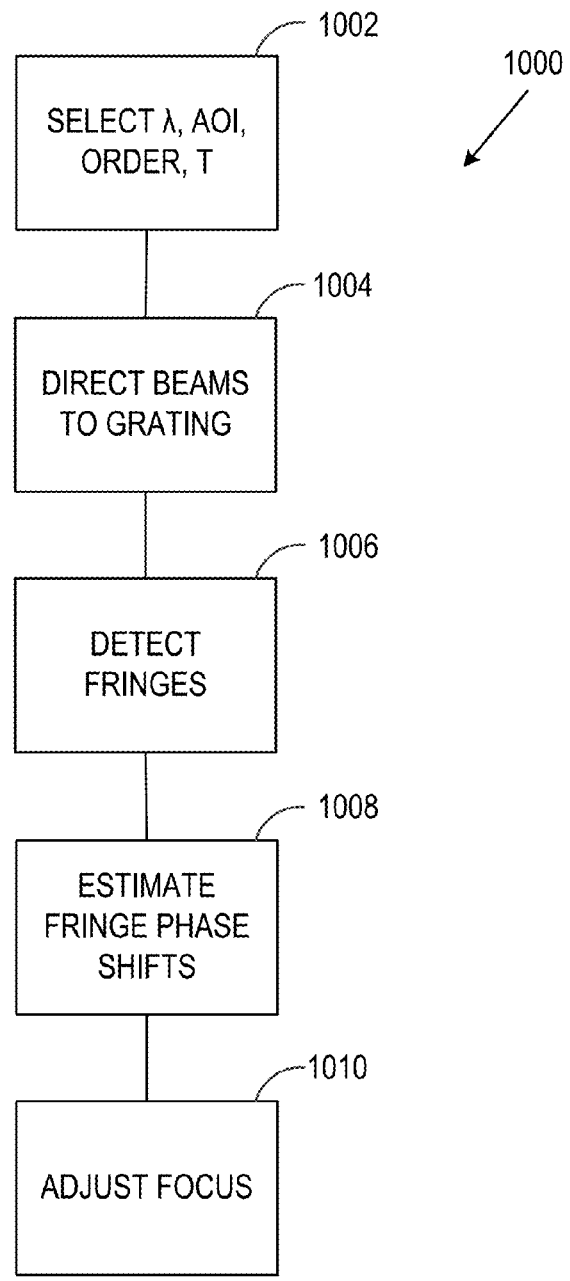
FIG. 10 is a block diagram of a representative fringe projection method.

With reference to FIG. 10, a fringe projection method includes selecting appropriate parameters at 1002 so that sin $\theta$ sin $\Delta\theta$ is constant. Parameters to be selected include wavelengths, diffraction orders, grating pitches, angles of incidence as well as details of how wavelength components are to be separated, combined, and selected for direction to a reference or substrate surface. In some cases, different grating pitches are provided in a common grating area. At 1004, optical beams are selected based on these parameters and directed to a grating configured based on the appropriate parameters. At 1006, fringe patterns associated with substrate surfaces and a reference surface are detected, and at 1008, phase shifts are estimated. At 1010, focus can be adjusted by translations of one or more of a substrate, reticle, or a projection lens.

EXAMPLE 6

Representative Exposure Apparatus

Figure 11:
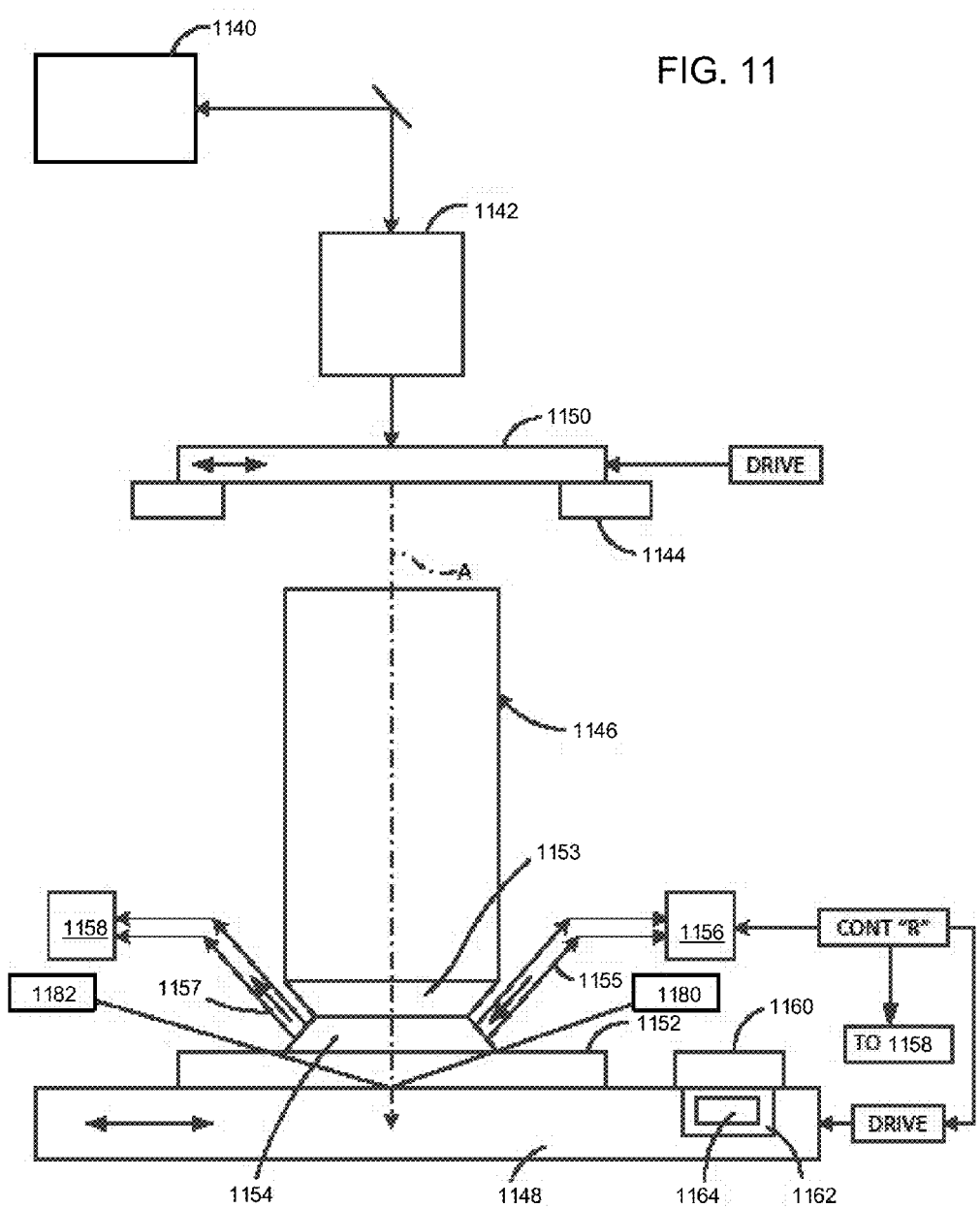
FIG. 11 illustrates an immersion lithography system.

The methods and apparatus disclosed above can be used in conjunction with various precision systems such as various types of lithography systems and other wafer processing systems and methods. Turning to FIG. 11, certain features of an immersion lithography system (an exemplary precision system) are shown, namely, a light source 1140, an illumination-optical system 1142, a reticle stage 1144, a projection-optical system 1146, and a wafer (substrate) stage 848, all arranged along an optical axis A. The light source 1140 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 1142 includes an optical integrator and at least one lens that conditions and shapes the illumination beam for illumination of a specified region on a patterned reticle 1150 mounted to the reticle stage 1144. The pattern as defined on the reticle 1150 corresponds to the pattern to be transferred lithographically to a wafer 1152 that is held on the wafer stage 1148. Lithographic transfer in this system is by projection of an aerial image of the pattern from the reticle 1150 to the wafer 1152 using the projection-optical system 1146. The projection-optical system 1146 typically comprises many individual optical elements (not detailed) that project the image at a specified demagnification ratio (e.g., 1/4 or 1/5) on the wafer 1152. So as to be imprintable, the wafer surface is coated with a layer of a suitable exposure-sensitive material termed a "resist."

The reticle stage 1144 is configured to move the reticle 1150 in the X-direction, Y-direction, and rotationally about the Z-axis. To such end, the reticle stage is equipped with one or more linear motors having cooled coils as described herein. The two-dimensional position and orientation of the reticle 1150 on the reticle stage 1144 are detected by a laser interferometer or an encoder system (not shown) in real time, and positioning of the reticle 1150 is effected by a main control unit on the basis of the detection thus made.

The wafer 1152 is held by a wafer holder ("chuck," not shown) on the wafer stage 1148. The wafer stage 1148 includes a mechanism (not shown) for controlling and adjusting, as required, the focusing position (along the Z-axis) and the tilting angle of the wafer 1152. The wafer stage 1148 also includes electromagnetic actuators (e.g., linear motors or a planar motor, or both) for moving the wafer in the X-Y plane substantially parallel to the image-formation surface of the projection-optical system 1146. These actuators desirably comprise linear motors, one more planar motors, or both.

The wafer stage 1148 also includes mechanisms for adjusting the tilting angle of the wafer 1152 by an auto-focusing and auto-leveling method. Thus, the wafer stage serves to align the wafer surface with the image surface of the projection-optical system. The two-dimensional position and orientation of the wafer are monitored in real time by another laser interferometer (not shown). Control data based on the results of this monitoring are transmitted from the main control unit to a drive circuits for driving the wafer stage. During exposure, the light passing through the projection-optical system is made to move in a sequential manner from one location to another on the wafer, according to the pattern on the reticle in a step-and-repeat or step-and-scan manner. Autofocus can be accomplished with methods and apparatus as described above.

The projection-optical system 1146 normally comprises many lens elements that work cooperatively to form the exposure image on the resist-coated surface of the wafer 1152. For convenience, the most distal optical element (i.e., closest to the wafer surface) is an objective lens 1153. Since the depicted system is an immersion lithography system, it includes an immersion liquid 1154 situated between the objective lens 1153 and the surface of the wafer 1152. As discussed above, the immersion liquid 1154 is of a specified type. The immersion liquid is present at least while the pattern image of the reticle is being exposed onto the wafer.

The immersion liquid 1154 is provided from a liquid-supply unit 1156 that may comprise a tank, a pump, and a temperature regulator (not individually shown). The liquid 1154 is gently discharged by a nozzle mechanism 1155 into the gap between the objective lens 1153 and the wafer surface. A liquid-recovery system 1158 includes a recovery nozzle 1157 that removes liquid from the gap as the supply 1156 provides fresh liquid 1154. As a result, a substantially constant volume of continuously replaced immersion liquid 1154 is provided between the objective lens 1153 and the wafer surface. The temperature of the liquid is regulated to be approximately the same as the temperature inside the chamber in which the lithography system itself is disposed.

Also shown is a sensor window 1160 extending across a recess 1162, defined in the wafer stage 1148, in which a sensor 1164 is located. Thus, the window 1160 sequesters the sensor 1164 in the recess 1162. Movement of the wafer stage 1148 so as to place the window 1160 beneath the objective lens 1153, with continuous replacement of the immersion fluid 1154, allows a beam passing through the projection-optical system 1146 to transmit through the immersion fluid and the window 1160 to the sensor 1164.

A fringe projection system 1180 is situated to project fringes to the wafer 1152 and a reference surface, and a detection system 1182 is configured to detect a portion of the fringe pattern. The detected beam can be used as described above to assess focus so that suitable system adjustments can be made to correct, prevent, or at least partially compensate focus shifts.

The present embodiment is also applicable to the AF sensor in liquid immersion type exposure apparatus, for example, as disclosed in U.S. Patent Application Publication No. 2011/0086315.

Furthermore, the above embodiments can also be used in combination with the AF sensor configured to reduce errors due to reflecting surfaces as disclosed, for example, in U.S. Patent Application Publication No. 2009/0116039, and U.S. Pat. No. 8,149,382.

Further, in the embodiment above, a light transmissive type mask (reticle) is used, which is obtained by forming a predetermined light-shielding pattern (or a phase pattern or a light-attenuation pattern) on a light-transmitting substrate, but instead of this reticle, as disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display element (spatial light modulator) or the like) on which a light-transmitting pattern, a reflection pattern, or an emission pattern is formed according to electronic data of the pattern that is to be exposed can also be used. In the case of using such a variable shaped mask, a stage on which a work piece e.g. a wafer, a glass plate or the like is mounted is scanned relative to the variable shaped mask, and therefore the equivalent effect to the embodiment above can be obtained by measuring the position of this work piece using an the focus system.

Further, as disclosed in, for example, PCT International Publication No. 2001/035168, the embodiment above can also be applied to an exposure apparatus (a lithography system) in which line-and-space patterns are formed on wafer W by forming interference fringes on the substrate 1152.

Moreover, the embodiment above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Incidentally, an object on which a pattern is to be formed (an object subject to exposure on which an energy beam is irradiated) in the embodiment above is not limited to a wafer, but may be another object such as a glass plate, a ceramic substrate, a film member, or a mask blank.

The usage of the exposure apparatus is not limited to the exposure apparatus used for manufacturing semiconductor devices, but the embodiment above can be widely applied also to, for example, an exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, the embodiment above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

The focus system and exposure apparatus according to the foregoing embodiments are manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Incidentally, the disclosures of all publications, the PCT International Publications, the U.S. patent application Publications and the U.S. patents that are cited in the description so far related to exposure apparatuses and the like are each incorporated herein by reference.

EXAMPLE 7

Representative Manufacturing Processes

Figure 12:
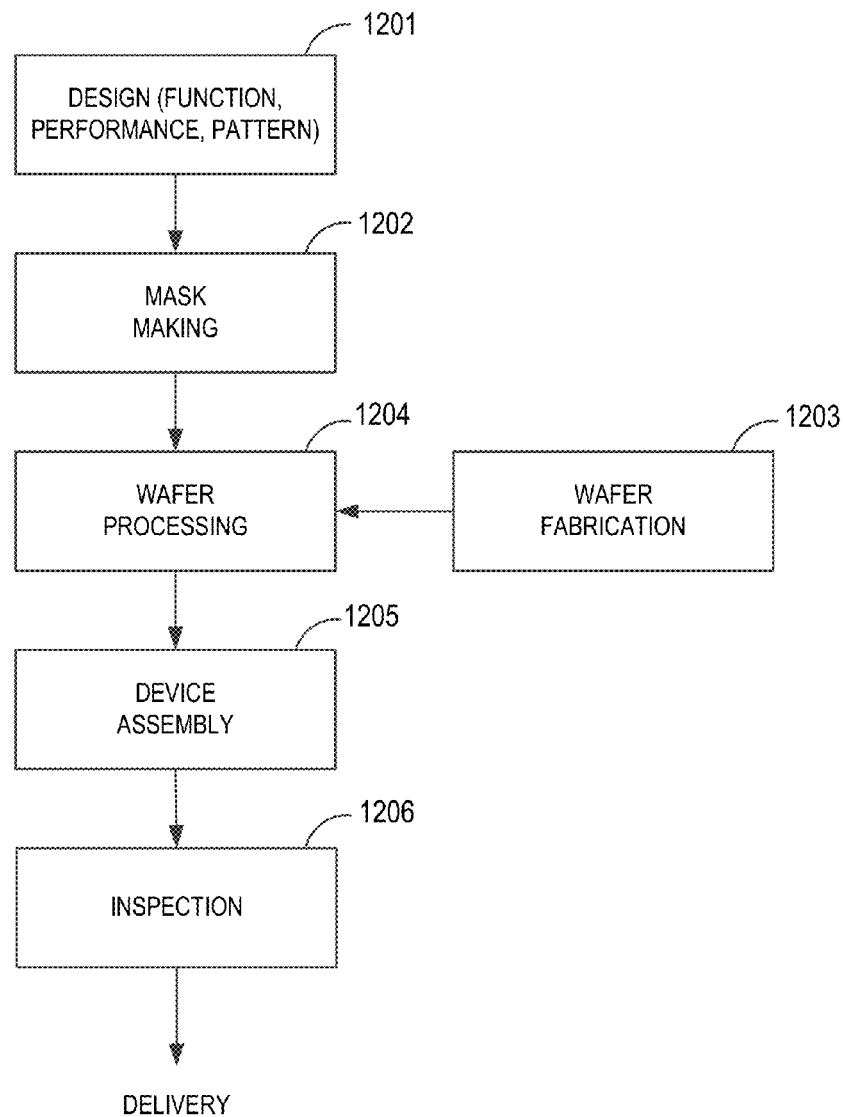
FIGS. 12-13 are schematic block diagrams of methods for device manufacturing.

An exemplary process for manufacturing semiconductor devices, including an exposure step, is shown in FIG. 12. Such methods can also include the autofocus error correction and identification as described above. In step 1201 the device's function and performance characteristics are designed. Next, in step 1202, a mask (reticle) having a desired pattern is designed according to the previous designing step, and in a parallel step 1203 a wafer is made from a suitable semiconductor material. The mask pattern designed in step 1202 is exposed onto the wafer from step 1203 in step 1204 by a microlithography system having an AF system such as disclosed herein. In step 1205 the semiconductor device is assembled including the dicing process, bonding process, and packaging process. Finally, the device is inspected in step 1206.

Figure 13:
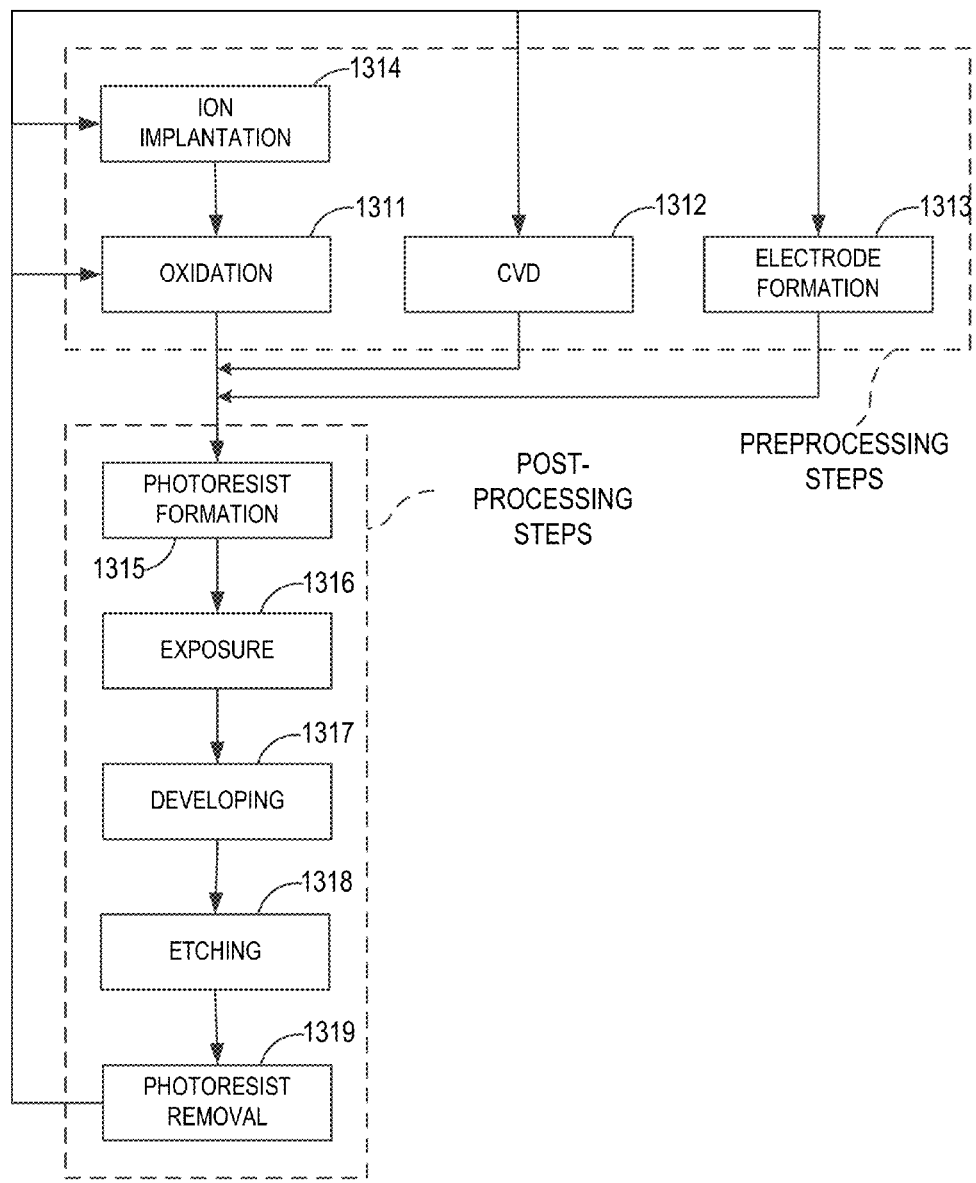

FIG. 13 is a flowchart of the above-mentioned step 1304 in the case of fabricating semiconductor devices. In FIG. 13 in step 1311 (oxidation step), the wafer surface is oxidized. In step 1312 (CVD step), an insulation film is formed on the wafer surface. In step 1313 (electrode-formation step), electrodes are formed on the wafer by vapor deposition. In step 1314 (ion-implantation step), ions are implanted in the wafer. The above-mentioned steps 1311-1314 constitute the preprocessing steps for wafers during wafer processing, and selection is made at each step according to processing requirements.

At each stage of wafer-processing, when the above-mentioned pre-processing steps have been completed, the following "post-processing" steps are implemented. During post-processing, first, in step 1315 (photoresist-formation step), photoresist is applied to a wafer. Next, in step 1316 (exposure step), the above-mentioned exposure device is used to transfer the circuit pattern of a mask (reticle) to a wafer. Then, in step 1317 (developing step), the exposed wafer is developed, and in step 1318 (etching step), parts other than residual photoresist (exposed material surface) are removed by etching. In step 1319 (photoresist-removal step), unnecessary photoresist remaining after etching is removed. Multiple circuit patterns are formed by repeating these pre-processing and post-processing steps.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A system for lithography, comprising:
a fringe projection system including a radiation source which emits at least a first radiation beam of a first wavelength and a second radiation beam of a second wavelength different from the first wavelength, a diffraction grating which has a first portion of a first grating pitch and a second portion of a second grating pitch different from the first grating pitch, and a projection optical system configured to project fringes using the first radiation beam from the first portion and the second radiation beam from the second portion; and a detection system configured to receive the projected fringes and determine a fringe phase.

2. The system of claim 1, further comprising a controller configured to adjust a focus of a reticle pattern on a target surface based on the determined fringe phase.

3. The system of claim 2, wherein the fringe phase contributions correspond to target surface displacements and optical path length variations associated with propagation of the at two optical beams are substantially independent of wavelength for the at least two optical beams.

4. The system of claim 1, wherein the fringe phase contributions correspond to target surface displacements and optical path length variations associated with propagation of the at least two optical beams are independent of wavelength for the at least two optical beams.

5. The system of claim 4, wherein the diffraction grating is situated so that the at least two optical beams are incident to the diffraction grating at angles of incidence so that target surface displacements and optical path length variations associated with propagation of the optical beams are substantially independent of wavelength for the at least two optical beams.

6. The system of claim 5, wherein the fringe projection system is configured so that projected fringes associated with the at least two optical beams are based on common diffraction orders for the at least two optical beams.

7. The system of claim 5, wherein the fringe projection system is configured so that projected fringes associated with the at least two optical beams are based on at least one different diffraction orders for the at least two optical beams.

8. The system of claim 7, wherein the fringe projection system includes an aperture plate situated to block at least one diffraction order associated with each of the at least two optical beams.

9. The system of claim 8, wherein the aperture plate is situated to block at least one diffraction order that is different for each of the at least two beams.

10. The system of claim 1, wherein the fringe projection system is configured so two diffraction orders are selected for each of the at least two optical beams such that $\sin \theta \sin \Delta\theta$ is substantially the same for the at least two optical beams, wherein $\theta$ is an average angle of incidence and $\Delta\theta$ is a diffraction angle difference between the two diffraction orders.

11. The system of claim 4, wherein the diffraction grating is configured to have at least two grating pitches corresponding to the at least two optical beams so that target surface displacements and optical path length variations associated with propagation of the optical beams are substantially independent of wavelength for the at least two optical beams.

12. The system of claim 11, wherein the fringe projection system is configured so that projected fringes associated with the at least two optical beams are based on common diffraction orders for the at least two optical beams.

13. The system of claim 11, wherein the fringe projection system is configured so that projected fringes associated with the at least two optical beams are based on at least one different diffraction order for the at least two optical beams.

14. The system of claim 11, wherein the fringe projection system includes an aperture plate situated to block at least one diffraction order associated with each of the at least two optical beams.

15. The system of claim 14, wherein the aperture plate is situated to block at least one diffraction order that is different for each of the at least two beams.

16. The system of claim 11, wherein the fringe projection system is configured so that two diffractions orders are selected for each of the at least two optical beams such that $\sin \theta \sin \Delta\theta$ is substantially the same for the at least two optical beams, wherein $\theta$ is an average angle of incidence and $\Delta\theta$ is a diffraction angle difference between the two diffraction orders.

17. The system of claim 11, wherein the diffraction grating includes a first grating segment and a second grating segment associated with the first and second grating pitches, respectively.

18. The system of claim 17, wherein the diffraction grating is situated so that the at least two optical beams are incident to the diffraction grating at a common angle of incidence.

19. The system of claim 17, wherein the diffraction grating is situated so that diffraction orders that form the projected fringes are diffracted at substantially the same diffraction angles for the at least two optical beams.

20. The system of claim 19, wherein the fringe projection optical system includes a beam combiner situated to received diffraction orders from the segmented gratings and direct the diffraction orders along respective common optical paths.

21. The system of claim 20, wherein the beam combiner includes a dichroic filter configured to reflect diffraction orders associated with a first of the at least two optical beams and transmit diffraction orders associated with a second of the at least two optical beams so as to direct diffraction orders of the first or second of the at least two optical beams to the common optical paths.

22. The system of claim 21, wherein the dichroic filter is configured to reflect diffraction orders associated with a first of the at least two optical beams so as to direct diffraction orders of the first of the at least two optical beams to the common optical paths.

23. The system of claim 22, wherein the beam combiner includes a reflective surface configured to reflect the diffraction orders of the second of the at least two optical beams so as to direct diffraction orders of the second of the at least two optical beams to the common optical paths.

24. The system of claim 1, wherein the fringe projection system includes a sending-side beam splitter configured to receive diffraction orders associated with a first optical beam and a second optical beam of the at least two optical beams and direct the first optical beam to a reference surface and the second beam to a target surface.

25. The system of claim 24, wherein the fringe projection system includes a receiving-side beam splitter configured to receive diffraction orders associated with the first optical beam and the second optical beam from the reference surface and the target surface, respectively, and direct the combined first and second optical beams to a detector.

26. The system of claim 25, wherein the sending-side beam splitter is configured to reflect the first optical beam to the reference surface, and the receiving-side beam splitter is configured to reflect the second optical beam.

27. The system of claim 25, wherein the sending-side beam splitter is configured to transmit the first optical beam to the reference surface, and the receiving-side beam splitter is configured to transmit the second optical beam.

28. The system of claim 25, wherein the sending-side beam splitter and the receiving-side beam splitter include respective dichroic reflectors.

29. The system of claim 11, wherein the diffraction grating defines gratings of different pitches for the at least two optical beams in a common grating area, and the at least two optical beams are directed to the common grating area.

30. The system of claim 29, wherein the diffraction grating is situated so that the at least two optical beams are incident to the common grating area at a common angle of incidence.

31. The system of claim 29, wherein the diffraction grating is situated so that diffraction orders that form the projected fringes are diffracted by the common grating area at substantially the same diffraction angles for the at least two optical beams.

32. The system of claim 29, wherein the fringe projection optical system includes a beam combiner situated to received diffraction orders from the common grating area of the diffraction grating and direct the diffraction orders along respective common optical paths.

33. The system of claim 32, wherein the beam combiner includes a dichroic filter configured to reflect diffraction orders associated with a first of the at least two optical beams and transmit diffraction orders associated with a second of the at least two optical beams so as to direct diffraction orders of the first or second of the at least two optical beams to the common optical paths.

34. The system of claim 32, wherein dichroic filter is configured to reflect diffraction orders associated with a first of the at least two optical beams so as to direct diffraction orders of the first of the at least two optical beams to the common optical paths.

35. The system of claim 22, wherein the beam combiner includes a reflective surface configured to reflect the diffraction orders of the second of the at least two optical beams so as to direct diffraction orders of the second of the at least two optical beams to the common optical paths.

36. The system of claim 1, wherein the diffraction grating has a variable grating period selected so that diffraction angles for at the at least two optical beam are substantially the same.

37. The system of claim 36, further comprising a controller configured to provide an indication of a displacement based on fringes projected onto a reference surface.

38. The system for lithography according to claim 1, further comprising:
   a projection system configured to image a reticle on a sensitized substrate; and
   a controller configured to adjust focus based on the determined fringe phase.

39. The lithographic system of claim 38, wherein the fringe projection system is configured to project fringes so that diffraction orders for the plurality of wavelengths propagate along common paths.

40. The lithographic system of claim 38, wherein the fringe projection system is configured to project fringes on a substrate surface and a reference surface, wherein the controller configured to adjust focus based on a fringe phase associated with the reference surface.

41. The lithographic system of claim 40, wherein fringe portions associated with the reference surface and the substrate surface propagate along a common optical path at the detection system.

42. The system of claim 1 wherein the first radiation beam and the second radiation beam are incident on the diffraction grating at different angles of incidence.

43. The system of claim 42, wherein the first radiation beam is incident on the first portion of the diffraction grating, and the second radiation beam is incident on the second portion of the diffraction grating.

44. The system of claim 43, wherein a propagation direction of the first and second radiation beams from the diffraction grating are same.

* * * * *